United States Patent
Jenq et al.

(10) Patent No.: US 6,258,651 B1
(45) Date of Patent: Jul. 10, 2001

(54) METHOD FOR FORMING AN EMBEDDED MEMORY AND A LOGIC CIRCUIT ON A SINGLE SUBSTRATE

(75) Inventors: Jason Jyh-Shyang Jenq, Ping-Tong; Hal Lee, Taipei, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/469,013

(22) Filed: Dec. 21, 1999

(51) Int. Cl.⁷ .............................................. H01L 21/8242
(52) U.S. Cl. ......................... 438/238; 438/253; 438/651
(58) Field of Search ............................... 438/238–239, 438/250–256, 381, 393–399, 649, 651, 682

(56) References Cited

U.S. PATENT DOCUMENTS 6,074,908 * 6/2000 Huang ................................... 438/241

* cited by examiner

Primary Examiner—Jey Tsai

(57) ABSTRACT

A method for forming an integrated circuit device that incorporate both an array of memory cells and an array of logic circuits on a single chip or substrate is disclosed. The substrate has a transfer field effect transistor (FET) with a first gate electrode and a first source/drain region formed in and on a embedded DRAM region of the substrate and has a logic FET with a second gate electrode and a second source/drain region formed in and on a logic circuit region of the substrate. Next, a dielectric layer was deposited over the exposing surface of said transfer FET and above of the logic FET. Moreover, the dielectric layer was polished until upper surface of the first gate electrode and the second gate electrode is exposed. Subsequently, a photoresist layer is formed over the dielectric layer and the first gate electrode. And then the dielectric layer was etched until upper surface of the logic FET is exposed. Next, the photoresist layer was removed. Finally, a self-aligned silicide layer was deposited simultaneously over the exposed second gate electrode, over the second source/drain region and over the exposed first gate electrode.

13 Claims, 7 Drawing Sheets

METHOD FOR FORMING AN EMBEDDED MEMORY AND A LOGIC CIRCUIT ON A SINGLE SUBSTRATE

BACKGROUND OF THE INVENTION

1. Field of the Invention

The present invention relates to the formation of integrated circuit devices that incorporate both an array of memory cells and an array of logic circuits on a single chip or substrate.

2. Description of the Prior Art

Recently, demand for semiconductor devices has rapidly increased owing to widespread use of integrated electronic circuit. In particularly, as more than hundreds or thousands of electrical components are integrated into the ICs, a mean for higher quality of semiconductor device and more simplification fabrication has become imperative.

For some data processing applications, it has become desirable to provide integrated circuit devices that incorporate on the same chip both arrays of memory cells and arrays of high-speed logic circuits like those typically used in microprocessors or digital signal processors. It might, for example, be desirable to provide an array of dynamic random access memory cells within the integrated circuit device to provide dedicated comparatively high-speed access to a significant amount of data storage for the logical circuits of the integrated circuit device. Applicants that could benefit from the provision of such embedded DRAM include logic circuits that process large amounts of data, such as graphics processors. Providing both high-speed logic circuits and embedded DRAM on the same chip requires that certain aspects of the process flow used for making the chip be dedicated to the formation of logic circuits and that other aspects be dedicated to the formation of memory cells. FIGS. 1A–1C illustrate a portion of a process flow that might be used to provide embedded DRAM on an integrated circuit device that includes high speed logic circuits.

FIG. 1A illustrates an integrated circuit device at an intermediate processing stage that will include embedded DRAM and an array of logic circuits. On the left side of the illustrated device is an exemplary DRAM cell and on the right side of the illustrated device is an exemplary logic FET that makes up part of a logic circuit. Other circuitry for performing input/output (I/O) functions for the integrated circuit device would typically be included but is not shown here.

The embedded DRAM cell, when complete, will include a transfer or pass field effect transistor (FET) coupled to a charge storage capacitor. The transfer FET acts as a switch for selectively coupling the lower electrode of the charge storage capacitor to a bit line so that data can either be read from or stored to the charge storage capacitor. The embedded DRAM and logic circuits of the integrated circuit device are formed on a single silicon substrate 100, which typically has at least a surface layer of P-type material. Device isolation regions 200 are provided as necessary across the substrate of the device. The illustrated device isolation regions 200 may be fixed oxide regions formed in a modified local oxidation of silicon (LOCOS) process or may be shallow trench isolation (STI) devices consisting of the trenches filled with oxide by chemical vapor deposition (CVD). The illustrated cross section of the embedded DRAM cell includes a section through a transfer FET 400. Oxide spacer structure 500 are provided on either side of the gate electrode, typically be CVD oxide deposition followed by an etch back process. Oxide spacer structures 500 provide lateral protection to the gate electrode during processing and might also be used in the formation of lightly doped drain (LDD) 600 structures for the source and drain regions of the transfer field effect transistor (FET). Source/drain regions 600 are formed by self aligned ion implantation of N-type dopants on either side of the gate electrode 400 to complete the transfer FET.

Portions of the logic circuitry, schematically illustrated on the right of FIGS. 1A–1C, are formed nearly contemporaneously with the formation of the transfer FET of the DRAM array. Depending on design choices, some processing steps may be shared between the embedded DRAM and logic formation process or wholly distinct processes might be used for forming the DRAM and logic circuits. The exemplary FET 400 of the logic circuit is formed on a gate oxide layer 300 and includes a polysilicon gate electrode 400. It is generally preferred to not provide a self-aligned silicide layer over the polysilicon gate electrode layer 400 at the illustrated stage of the manufacturing process. Instead, it is generally preferred to use a self-aligned silicide ("salicide") process to form the FET of the logic circuit at a late stage in the manufacturing process. Oxide spacer 500 is formed on either side of the gate electrode 400 and is typically used in defining an LDD structure for the source/drain regions 700 of the logic FET.

After formation of the FET for the DRAM array and the logic array, it is typical to provide a thick oxide layer 800 over the entire substrate 100. The oxide layer is deposited to a sufficient thickness to both cover the various device structures and to provide a sufficient thickness for the planarization of the oxide layer 800. Planarization of the oxide layer 800 is important to improve the process latitude for the photolithography and etching steps used to form the charge storage capacitor. After provision of the planarized oxide layer, a via 900 is formed through the planarized oxide layer to expose the source/drain region 700 to which the charge storage of the illustrated DRAM cell will be connected. Doped polysilicon is provided within via 900 to form a vertical interconnect 1050 between the source/drain region 700 and the low electrode 1000 of the charge storage capacitor. The lower electrode 1000 of the charge storage capacitor is typically formed several layers of doped polysilicon. For the design rules typically used in modern processes, it is important to provide a three dimensional crown or fin capacitor structure for the lower electrode 1000 so that it has sufficient surface area to provide a sufficient level of charge storage for the capacitor. Such a crown or fin structure is necessary to ensure that the charge storage capacitor of the DRAM cell stores a sufficiently large charge to facilitate data reading and writing operations as well as to ensure that the stored charge remains on the charge storage capacitor for an acceptable amount of time without requiring a refresh operation. Formation of the charge storage capacitor continues by providing a capacitor dielectric layer 1100 consisting of the three layer oxide/nitride/oxide structure known as ONO over the lower capacitor electrode 1000. An upper electrode 1200 is formed by providing another layer of doped polysilicon, which is patterned in a manner conventional to DRAM arrays. The completed charge storage capacitor is shown in FIG. 1B.

After completion of the charge storage capacitor, a mask such as photoresist mask 1300 is provided over the FIG. 1B device to cover the embedded DRAM array and to expose the oxide layer 800 over the array of logic circuitry. Etching is performed to remove the thick oxide layer 800 from above the logic circuitry, resulting in the structure shown in FIG.

1C. Processing continues on the logic FET to form a silicide layer 1400 over the gate electrode 400 and silicide layers 1400 over the source/drain regions 700. The silicide layer 1400 reduces the resistivity and contact resistance of the gate electrode and the source/drain regions. Typically, the silicide layers are formed in a self-aligned ("salicide") process in which a layer of a refractory metal such as titanium is deposited over the exposed polysilicon gate electrode and the exposed silicon source/drain regions. An initial anneal is performed to convert a portion of the deposited metal layer to a metal silicide. An etch is performed to convert unreacted metal and then a second anneal is performed to achieve a low resistivity for the metal silicide layers 1400 on the gate electrode and source/drain regions. Processing continues to complete the integrated circuit device, which provides both logic circuitry and embedded DRAM circuitry.

To date, providing embedded DRAM for the logic circuits of an integrated circuit device to enhance the performance of the logic circuits and the device, as a whole has been an expensive process, which significantly reduces the yields for the desired integrated circuit device. It is accordingly desirable to provide a better process for forming embedded DRAM structures. According to conventional method, when this gate of DRAM cell array doesn't form a self-aligned process, this word-line has high resistance and high junction leakage.

For the foregoing reasons, there is a need for a method of forming embedded memory and logic circuits on a single substrate with self-aligned (salicide) process over the gate electrode to reduce the resistively.

SUMMARY OF THE INVENTION

In accordance with the present invention, a method is provided for forming an integrated circuit device including both an embedded memory and a logic circuit on a single substrate. A substrate is provided having a transfer FET formed in and on embedded memory region of the substrate and having a logic FET formed in and on logic circuit region of the substrate. Owing to the method, therefore substantially improving a salicide method so that the provided high quality of semiconductor device.

Another purpose of the present invention, which can provide both TiSi$_x$/poly gate or CoSi$_x$/poly gate, but only the source/drain of logic circuit region has a TiSi$_x$ or CoSi$_x$. A silicide layer forms over the partial memory cells, so the word-line of the embedded DRAM can reduce resistance. The one embodiment of the present invention will improve logic circuit has a high saturation current ($I_{DSAT}$) and faster speed, and it is also has a low junction leakage in the embedded DRAM region.

In one embodiment, the present invention provides a method, which includes a substrate. The substrate has a transfer field effect transistor (FET) with a first gate electrode and a first source/drain region formed in and on a embedded DRAM region of the substrate and has a logic FET with a second gate electrode and a second source/drain region formed in and on a logic circuit region of the substrate. Next, a dielectric layer was deposited over the exposing surface of the transfer FET and above of the logic FET. Moreover, the dielectric layer was polished until upper surface of the first gate electrode and the second gate electrode is exposed. Subsequently, a photoresist layer is formed over the dielectric layer and the first gate electrode. And then the dielectric layer was etched until upper surface of the logic FET is exposed. Next, the photoresist layer was removed. Finally, a self aligned silicide layer was deposited simultaneously over the exposed second gate electrode, over the second source/drain region and over the exposed first gate electrode.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Referring to FIGS. 2–5, the process flow of a preferred embodiment according to the present invention is depicted in cross-sectional views. These drawings merely show several key steps in sequential processes.

Figure 1A:
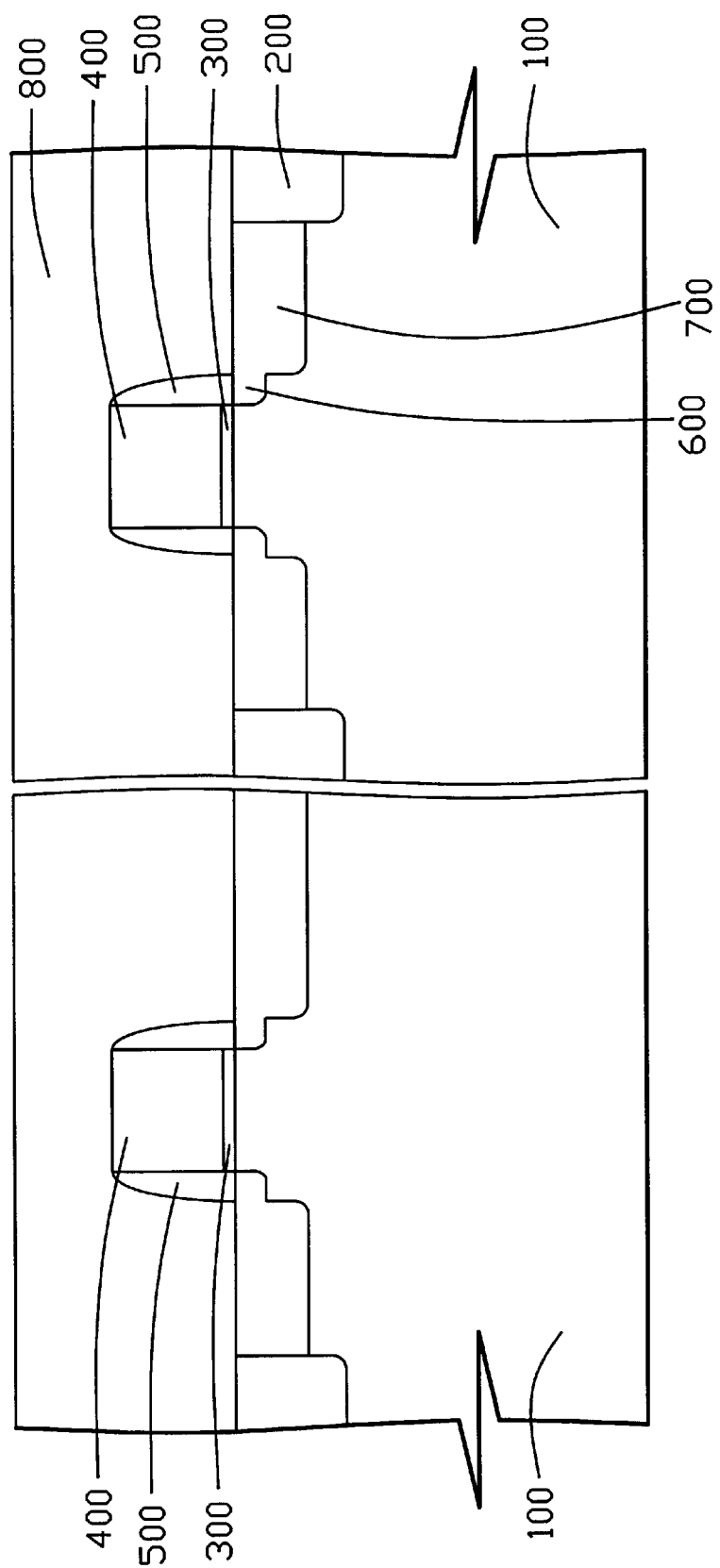
FIGS. 1A to 1C shows a conventional process in a conventional process for forming an embedded DRAM integrated circuit device.
Figure 1B:
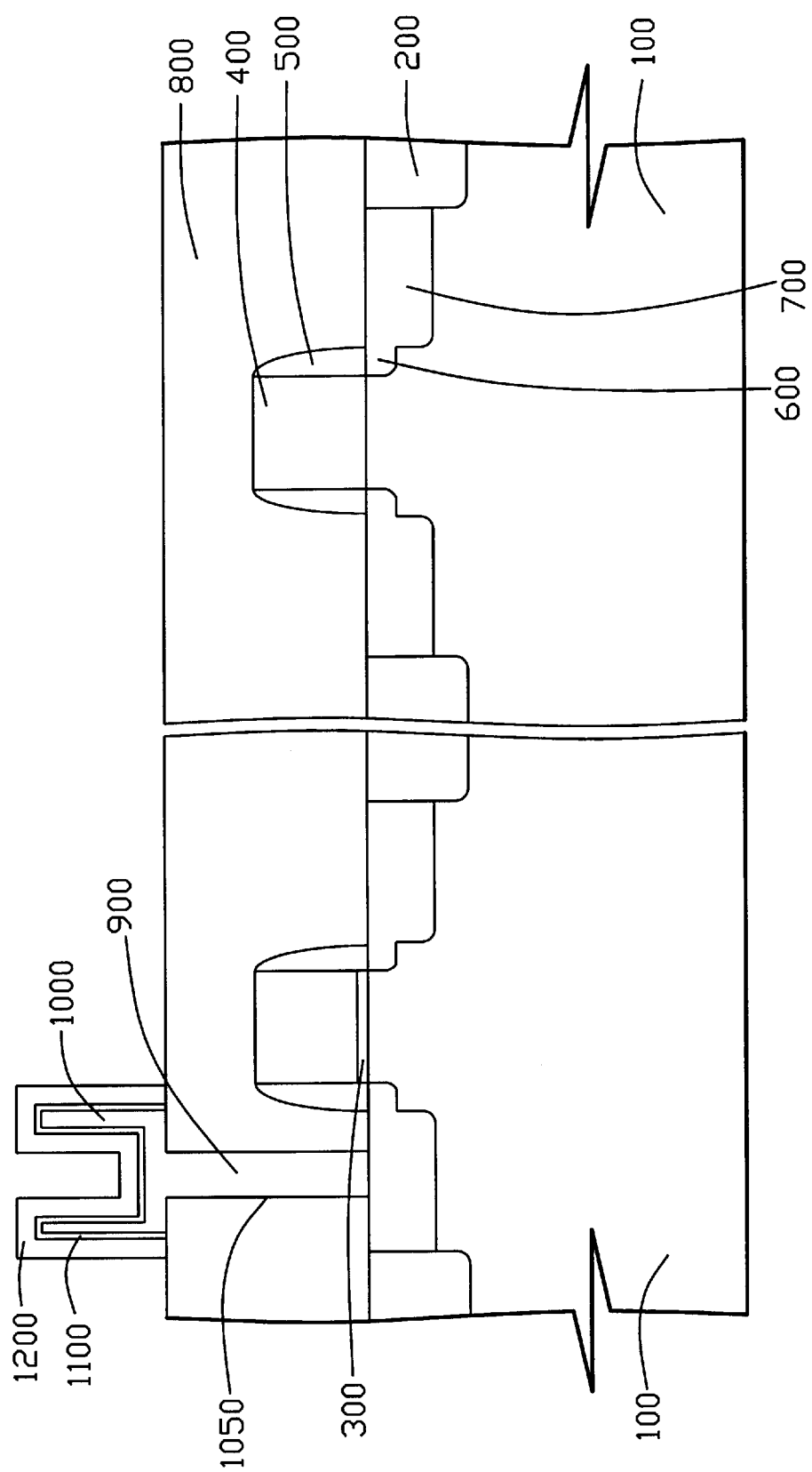
Figure 1C:
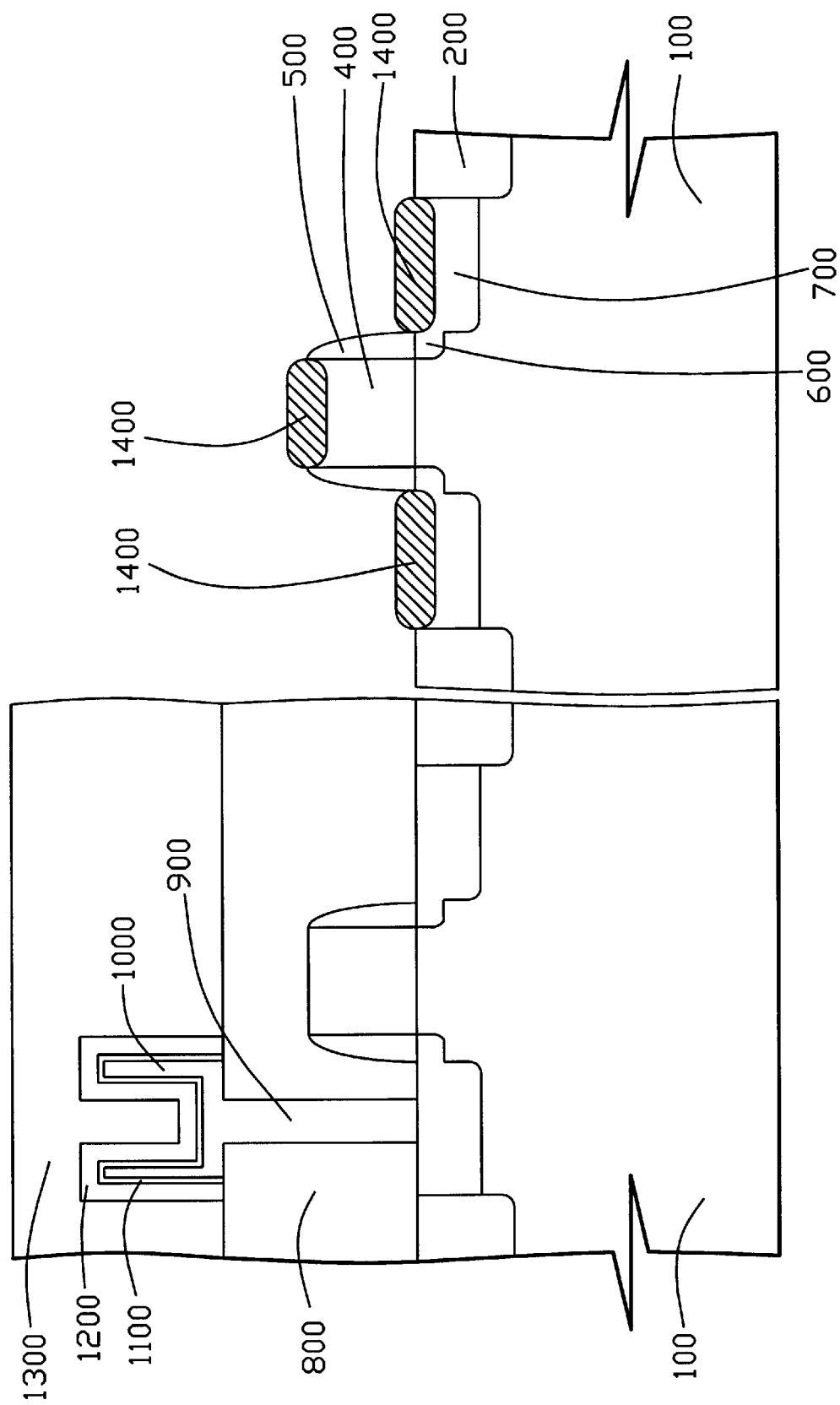
Figure 2:
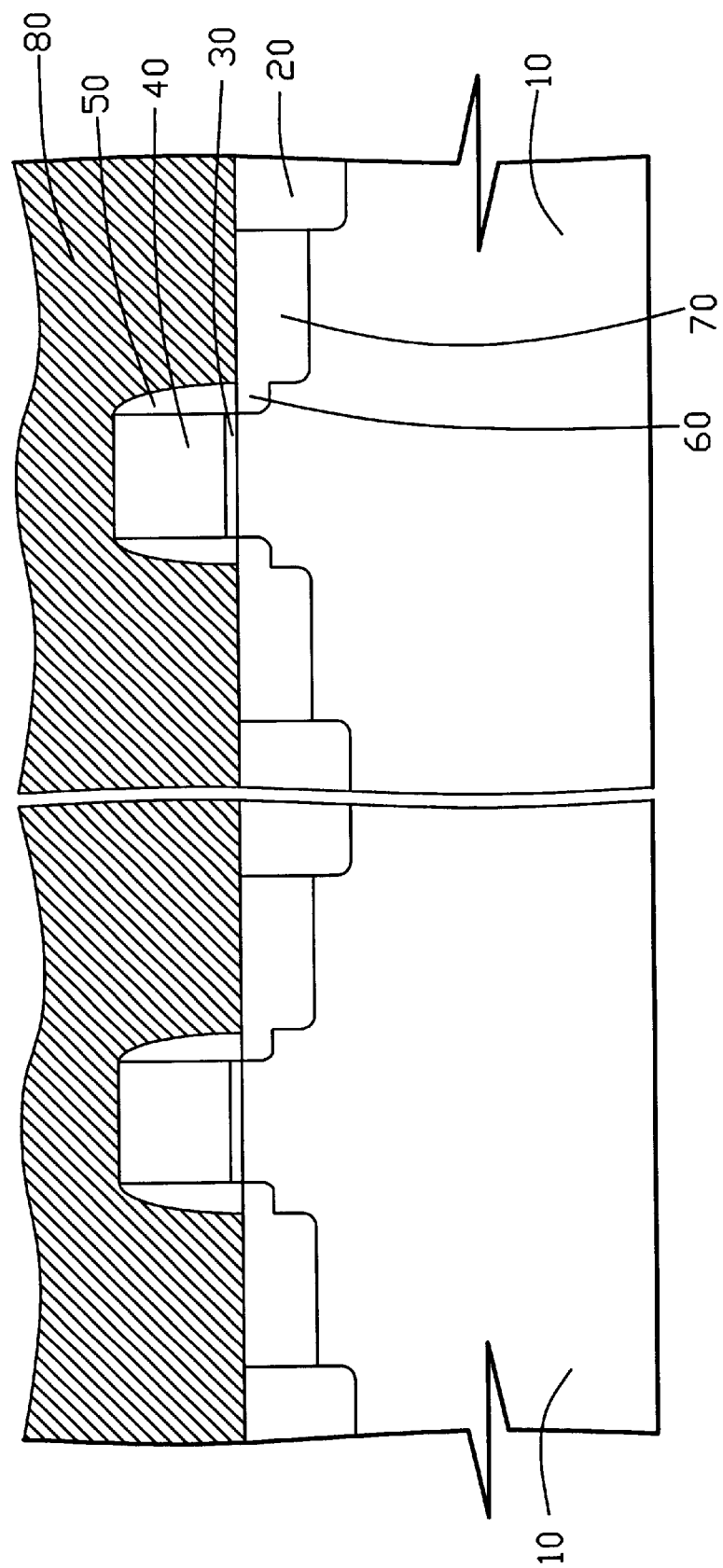
FIGS. 2 to 5 show cross-sectional views illustrative of various stages in the fabrication in accordance with one embodiment of the present invention.

Referring to FIG. 2, a silicon substrate 10 with p type conductivity is firstly provided wherein the silicon substrate 10 is defined an embedded DRAM region and a logic circuit region on a single substrate. However, it is appreciated that an n-type semiconductor substrate can be adapted. And then a plurality of field oxides 20 are formed on the silicon substrate 10, one of the field oxides is spaced from another of the field oxide by a field effect transistor (FET) region. The substrate 10 is then placed into a furnace, and is subjected to a thermal oxidation, such as a dry oxidation process, thus forming a gate oxide layer 30 containing silicon oxide to a thickness of about 100–250 angstroms. Next, a standard low-pressure chemical vapor deposition (LPCVD) is applied to form a polysilicon layer 40 having a thickness of about 1000–3000 angstroms on the gate oxide layer 30. Generally, Arsenic or Phosphorus atoms are implanted or diffused into the polysilicon layer 40 to reduce its resistivity. Using conventional photolithography techniques, a gate electrode structure is formed above silicon substrate 10 of embedded memory and logic circuit by anisotropically etched, for example, a conventional dry etch or reactive ion etch (RIE) technique. Thereby, a single substrate has a transfer field effect transistor (FET) with a first gate electrode formed in and on an embedded DRAM region of the substrate and has a logic FET with a second gate electrode formed in and on a logic circuit region of the substrate. Using the first gate electrode and second gate electrode as a doping mask, ions such as Arsenic with concentration of about $10^{13}/cm^2$ are implanted into the silicon substrate 10, generally followed by a thermal driving in and annealing in a temperature of about 900–1000° C., and is usually designated as N−. Two lightly doped regions 60 are thus formed. Next, a spacer 50 of about 600–700 angstroms is formed on the sidewalls of the first gate electrode and another spacer 50 is formed of the sidewalls of the second gate electrode, wherein the spacers are consisting with silicon nitride. Using the spacer 50 as a doping mask, N type ions such as Phosphorus or Arsenic with concentration of about $10^{15}/cm^2$ are implanted into the substrate 10, generally followed by a thermal driving in a temperature of about 900–1000° C., and is usually designated as N+. Two heavily doped regions 70 are in the substrate 10. It is noted that the concentration of the heavily doped regions 70 is higher than the concentration of the lightly doped region 60 mentioned above. Moreover, an inter-poly dielectric 80 is deposited over the exposing surface of the transfer FET and above of the logic FET by a chemical vapor deposition (CVD) method.

Figure 3:
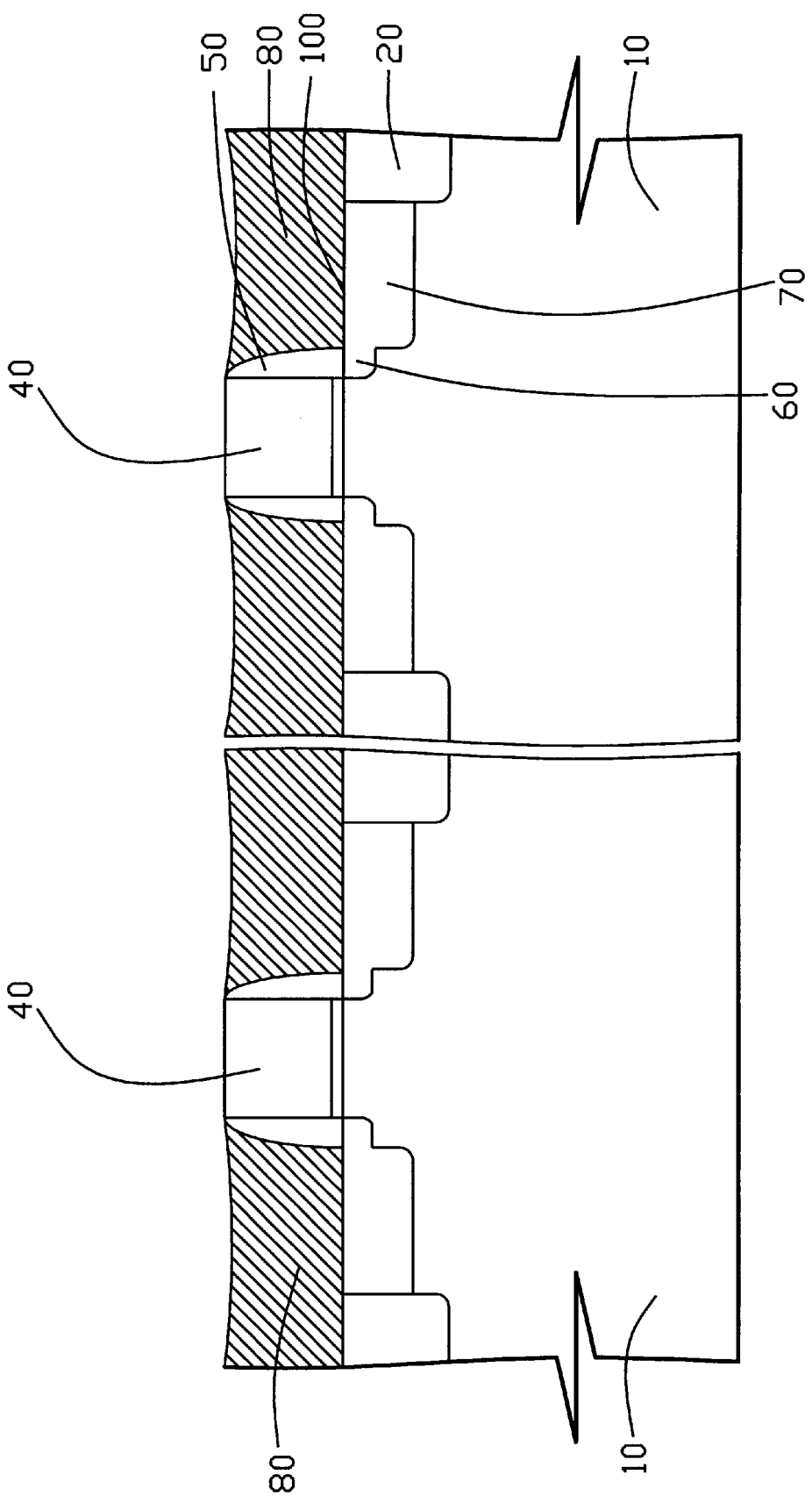
Figure 4:
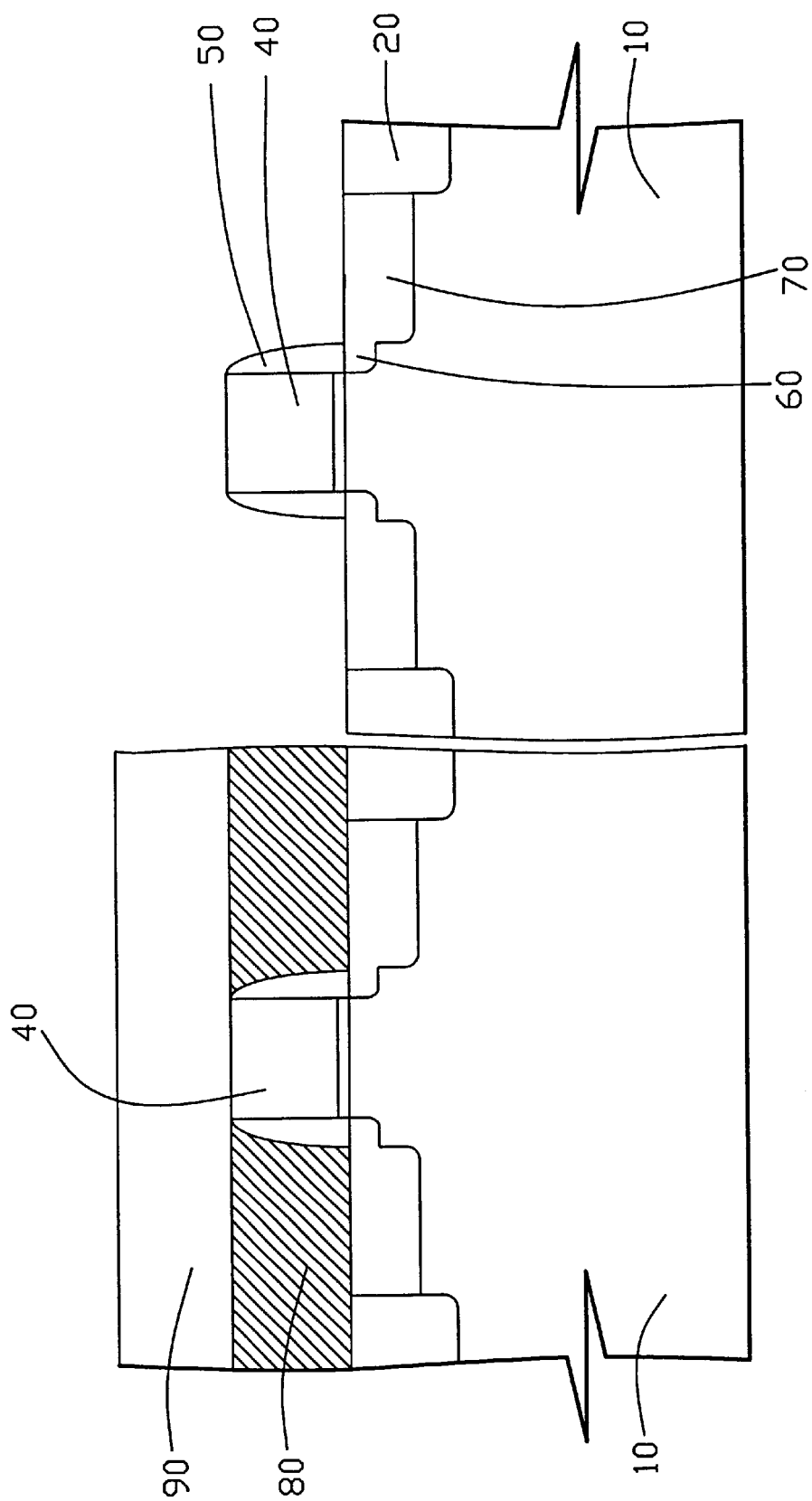

In the structure of FIG. 3, the inter-poly dielectric 80 is polished until upper surface of the first gate electrode 40 and the second gate electrode 40 is exposed by a chemical mechanical polishing method. Because the etching silicon oxide layer and silicon nitride layer have a different etching-ratio by chemical mechanical polishing, the polished inter-poly dielectric 80 is stopped the upper horizontal surface of first gate electrode and second gate electrode. Moreover, a photoresist layer 90 is formed over the inter-poly dielectric 80 and the first gate electrode 40 as shown in FIG. 4. Next, the inter-poly dielectric 80 is etched until upper surface of the logic FET is exposed. Sequentially, the photoresist layer 90 is removed.

Figure 5:
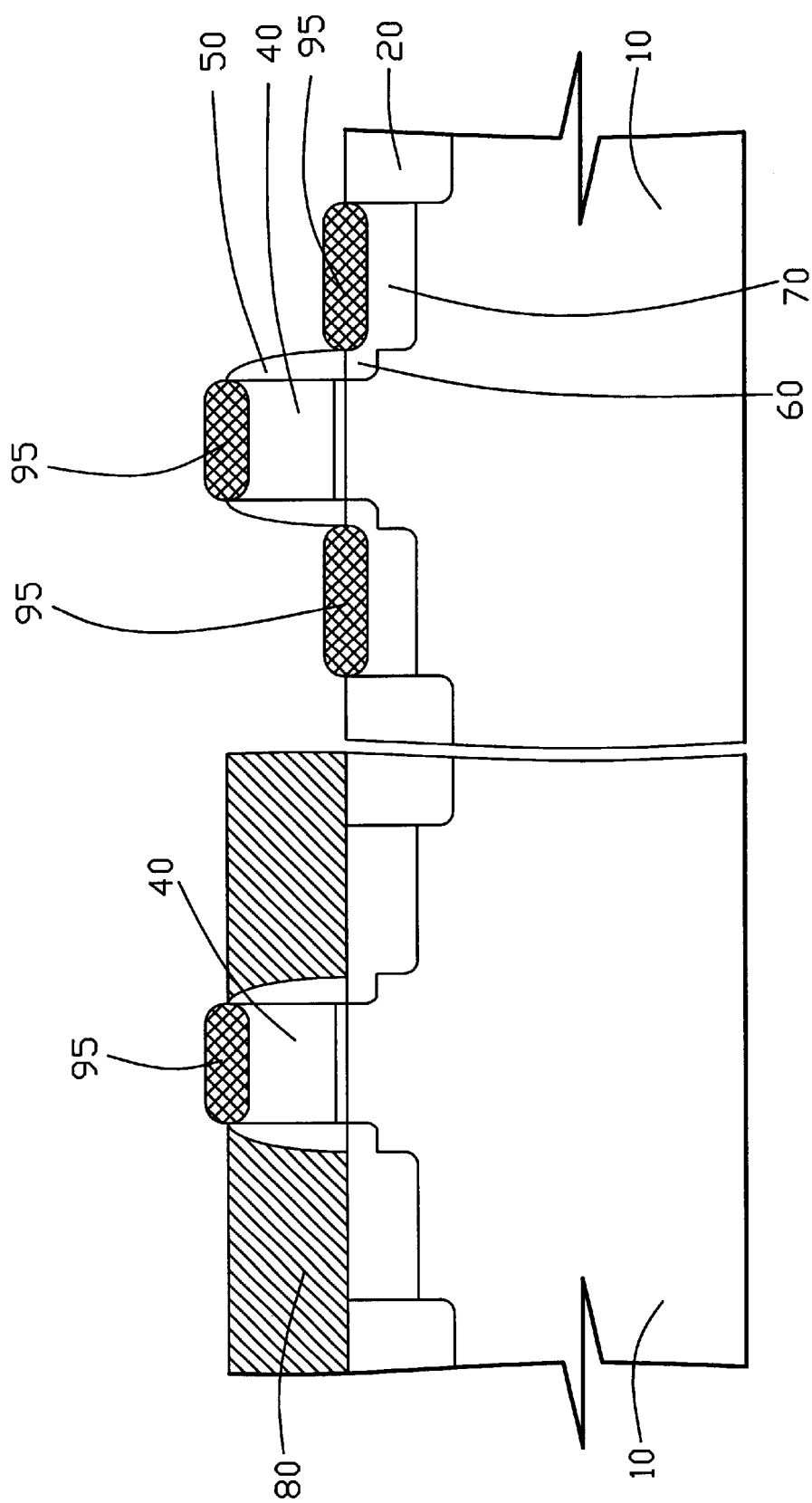

Finally, referring to the FIG. 5, this silicidation is performed by a traditional process such as self-aligned silicidation (or salicide), which generally includes firstly blanket sputtering a metal Titanium (Ti) or Cobalt (Co) layer 95 over the silicon substrate 10, followed by subjecting the substrate 10 in a high temperature. It makes the metal layer reacts with the underlying silicon substrate 10, thereby simultaneously depositing a self-aligned silicide layer 95 over the exposed second gate electrode, over the second source/drain region and over the exposed first gate electrode respectively. Those regions not reacted with the metal layer are then removed by, for example, a conventional wet etch. The process which can provide both $TiSi_x$/poly gate and $CoSi_x$/poly gate, but only the source/drain of logic circuit region has a $TiSi_x$ or $CoSi_x$. The one embodiment of the present invention will improve logic circuit has a high saturation current ($I_{DSAT}$) and faster speed, and it is also has a low junction leakage in the embedded DRAM region.

Although specific embodiments have been illustrated and described, it will be obvious to those skilled in the art that various modifications may be made without departing from what is intended to be limited solely by the appended claims.

What is claimed is:

1. A method for making an integrated circuit device, said method comprising:
providing a substrate having a transfer field effect transistor (FET) with a first gate electrode and a first source/drain region formed in and on a embedded DRAM region of said substrate and having a logic FET with a second gate electrode and a second source/drain region formed in and on a logic circuit region of said substrate;
depositing a dielectric layer over said exposing surface of said transfer FET and above of said logic FET;
polishing said dielectric layer until upper surface of said first gate electrode and said second gate electrode is exposed;
forming a photoresist layer over said dielectric layer and said first gate electrode;
etching said dielectric layer until upper surface of said logic FET is exposed;
removing said photoresist layer; and
simultaneously depositing a self-aligned silicide layer over said exposed second gate electrode, over said second source/drain region and over said exposed first gate electrode.

2. The method according to claim 1, wherein said dielectric layer comprises inter-poly dielectric.

3. The method according to claim 2, wherein said inter-poly dielectric comprises silicon dioxide.

4. The method according to claim 1, wherein said self-aligned silicide layer comprises Titanium silicide.

5. The method according to claim 1, wherein said self-aligned silicide layer comprises Cobalt silicide.

6. A method for making an integrated circuit device, said method comprising:
providing a silicon substrate having a transfer field effect transistor (FET) with a first gate electrode and a first source/drain region formed in and on a embedded DRAM region of said substrate and having a logic FET formed with second gate electrode and second source/drain region in and on a logic circuit region of said substrate;
depositing a inter-poly dielectric over the exposing surface of said transfer FET and of said logic FET;
polishing said inter-poly dielectric until upper surface of said first gate electrode and of said second gate electrode is exposed by chemical mechanical polishing method;
forming a photoresist layer over said inter-poly dielectric and said first gate electrode;
etching said inter-poly dielectric until upper surface of said logic FET is exposed;
removing the photoresist layer; and
simultaneously depositing a self-aligned silicide layer over said exposed second gate electrode, over said second source/drain region and over said exposed fist gate electrode.

7. The method according to claim 6, wherein said etching of the first gate electrode is done by a dry etch.

8. The method according to claim 7, wherein said dry etch comprises a reactive ion etch.

9. The method according to claim 6, wherein said etching of the second gate electrode is done by a dry etch.

10. The method according to claim 9, wherein said dry etch comprises a reactive ion etch.

11. The method according to claim 6, wherein said inter-poly dielectric comprises silicon dioxide.

12. The method according to claim 6, wherein said self-aligned silicide layer comprises Titanium silicide.

13. The method according to claim 6, wherein said self-aligned silicide layer comprises Cobalt silicide.

* * * * *